United States Patent [19]

Huyskens et al.

[11] Patent Number: 5,233,612
[45] Date of Patent: Aug. 3, 1993

[54] TEST DEVICE FOR AN ELECTRONIC CHIP

[75] Inventors: Eric Huyskens, Westmalle; Peter Reusens, Laarne; Urbain Swerts, Mortsel, all of Belgium

[73] Assignee: Alcatel n.v.,, Amsterdam, Netherlands

[21] Appl. No.: 713,469

[22] Filed: Jun. 10, 1991

[30] Foreign Application Priority Data

Jun. 18, 1990 [EP] European Pat. Off. ............ 90201602

[51] Int. Cl.[5] ............................................... G06F 11/00
[52] U.S. Cl. .................................... 371/16.2; 371/22.3
[58] Field of Search .................. 371/16.2, 22.3, 16.1, 371/15.1; 364/232.3 MS, 239.9 MS

[56] References Cited

U.S. PATENT DOCUMENTS

| | | | |
|---|---|---|---|
| 4,506,322 | 3/1985 | Leigh | 364/200 |
| 4,558,232 | 12/1985 | Simpson | 307/351 |
| 4,607,366 | 8/1986 | Stadlmeier et al. | 371/16.2 |
| 4,674,089 | 6/1987 | Poret et al. | 371/16.2 |
| 4,868,822 | 9/1989 | Scott et al. | 371/16.2 |
| 5,056,013 | 10/1991 | Yamamoto | 364/267.91 |

FOREIGN PATENT DOCUMENTS 0230219 7/1987 European Pat. Off. .

OTHER PUBLICATIONS

IBM Technical Disclosure Bulletin, vol. 23, No. 6, Nov. 1980, p. 2438, Armonk, US; L. L. Hart, et al., "Circuit card diagnosis at machine speed" *Whole article, especially paragraph 2*.
International Test Conference 1987 Proceedings; Sep. 1–3, 1987 pp. 717–723.
Proceedings of the IEEE 1989 Custom Integrated Circuits Conference; Town & Country Hotel, San Diego, Calif., May 15–18, 1989; pp. 22.4.1–22.4.4.

Primary Examiner—Robert W. Beausoliel, Jr.
Assistant Examiner—Phung My Chung
Attorney, Agent, or Firm—Frishauf, Holtz, Goodman & Woodward

[57] ABSTRACT

A test device for testing integrated electronic chips (EC) includes: a first processor; an interface for interfacing the first processor with a plurality of other circuits; and a second processor coupled to the first processor. In the test device, at least one of the plurality of other circuits is formed on the integrated electronic chip being tested. The interface includes a first scan path having a first string of first cells formed on the integrated electronic chip. The first string of first cells includes a plurality of serially connected first read buffers, a respective one of the first read buffers being provided in each first cell, for latching data and for transferring data between the at least one circuit of the plurality of other circuits and the first processor. A second scan path includes a second string of second cells, which includes a plurality of serially connected second read buffers, a respective one of the second read buffers being provided in each second cell for latching data and for transferring data between the second processor and the second scan path. The second processor and the first processor are coupled together via a serial interconnection connected between the first and second read buffers. A data transfer device serially transfers latched data from the first read buffer to said second read buffer and visa-versa, at a predetermined transfer rate such that one data transfer is provided at each of a plurality of processor steps of said second processor.

22 Claims, 3 Drawing Sheets

TEST DEVICE FOR AN ELECTRONIC CHIP

BACKGROUND OF THE INVENTION

The present invention relates to a test device for testing an integrated electronic chip including first processor means, said test device including interface means for interfacing said first processor means with other circuits, and second processor means coupled to said first processor means.

Such a test device is generally known in the art as an emulator. Therein the first processor means are replaced by the second processor means which are for instance more performant than the first ones or include a different software programme. The purpose of this test device is to check the behaviour of the other circuits together with these second processor means.

When the electronic chip is for instance only constituted by the first processor means, the socket wherein this chip is plugged may be considered as the interface means and to replace these first processor means by the second processor means this chip is removed from the socket and replaced therein by a connector linked to the second processor means.

In this way the test may be executed with the second processor means running at their normal processing speed. This allows to detect errors appearing only at that processing speed. Moreover, the test is performed by using the same environment, i.e. the other circuits, as when the first procesor means are operating. Thus this test allows detecting errors which do not appear when it is performed in a specific test environment, e.g. when specific test vectors are applied to the interface means instead of using the running second processor means. Indeed, in the case of using test vectors it is almost impossible to provide all the situations which may occur when the processor means are running in their real environment.

Due to the evolution of technology the size of the processor means is now so small that one or more of the above mentioned other circuits may also be integrated on the same chip. As a result it becomes difficult to have access to the interface means, now constituted by "pins" of the first processor means, since these pins are not accessible at the outside of the chip.

A solution to this problem of access would be to connect all these pins to the easily accessible external terminals of the chip. However, this solution is to be rejected because of the then required large number of external terminals and connections between the first processor means and these external terminals.

SUMMARY OF THE INVENTION

An object of the present invention is to provide a test device of the type mentioned above for testing an electronic chip in case this chip also includes, additionally to the first processor means, at least one of the above mentioned other circuits and without drastically increasing the number of external terminals of this chip, while allowing the second processor means to run at their normal processing speed.

According to the invention this object is achieved due to the fact that:
  at least one of said other circuits is built on said chip;
  said interface means include a first scan path constituted by a string of first cells built on said chip and including serially connected first read buffer means, one in each first cell, able to latch data normally transferred between said one circuit and said first processor means;
  said test device further includes a second scan path constituted by a string of second cells and including serially connected second read buffer means, one in each second cell, able to latch data transferred between said second processor means and said second scan path;
  said first processor means are coupled to said second processor means via the serial interconnection of said first and second read buffer means; and
  said test device also includes data transfer means able to serially transfer latched data from said first read buffer means to said second read buffer means, and vice versa, at a predetermined transfer rate such that one data transfer is performed at each processor step of said second processor means.

In this way, data which is normally transferred from the one circuit to the first processor means via the first cells—operating as a transparent device for this transfer—is also latched in the first buffer means of these cells and transferred to corresponding second buffers means from which it is then transmitted to the second processor means, or vice versa. Because the first and the second scan paths are connected in series, only two external terminals are required on the chip for transferring data irrespective of the number of buffer means. Moreover, the rate of data transfer from the first to the second scan paths, and reciprocally, may be so chosen that the second processor means are allowed to run at their normal processing speed.

It is to be noted that a test device including a scan path built on a chip is already known in the art, e.g. from the European patent application EP 0.313.230-A2. This scan path has the shape of a ring constituted by a plurality of input/output or latching cells including buffers for isolating the core logic of the chip from the external terminals thereof. In this known test device, input data is first loaded in the cells and then transmitted to the core logic which is constituted by electronic logical gates. The output data resulting from the handling of the input data by the logical gates is then transmitted back to the cells and transferred to the external terminals of the chip. However, this electronic chip is not provided with processor means associated with other circuits also built on the same chip or not. Thus with this test device there are no problems relating to the test of processor means running at their normal processing speed, i.e. to perform a functional test.

The present invention relates also to a test device for testing an integrated electronic chip carrying processor means.

Another object of the present invention is to provide a test device which observes the operations of the processor means of the chip while they operate in their real environment and run at their normal processing speed.

According to the invention, this other object is achieved due to the fact that said test device includes:
  interface means built on said chip for interfacing said processor means with other circuits and including a first scan path constituted by a string of first cells and including serially connected first read buffer means, one in each first cell, able to latch data normally transferred between said processor means and said circuits;

second processor means substantially identical to the first mentioned processor means and running at the same processing speed;

a second scan path constituted by a string of second cells and including serially connected second read buffer means, one in each second cell, able to latch data, said second read buffer means being serially interconnected with said first read buffer means;

data transfer means able to serially transfer the latched data from said first read buffer means to said second read buffer means, and vice versa, at a predetermined transfer rate such that one data transfer is performed between said first and second read buffer means at each processor step of said first processor means;

a third scan path constituted by a string of third cells and including serially connected third read buffer means, one in each third cell, able to latch data transferred between said second processor means and said third scan path; and comparator means able to compare, at each processor step, the data received in said third scan path from said second processor means with the data received in said second scan path from said first processor means.

In this way both the first and the second processor means may run at their normal processing speed and in a common environment which is the real environment of the first processor means, i.e. the other circuits. In other words, the test device acts as a so-called "watchdog" able to give an alarm when the results of the operations of the first processor means are different from those of the second processor means.

It is to be noted that because the other circuits are used in common by the first and by the second processor means and that the latter only can communicate with these other circuits by means of the transfer of data between the first and the second scan paths, such a transfer has to be done at each processing step of the processor means and for instance not until a predefined breakpoint in their software programme is reached. Indeed, in this last case the second processing means are not able to communicate with the other circuits before such a breakpoint.

Another characteristic feature of this test device is that at least one of said circuits is built on said chip.

BRIEF DESCRIPTION OF THE DRAWINGS

The above mentioned and other objects and features of the invention will become more apparent and the invention itself will be best understood by referring to the following description of an embodiment taken in conjunction with the accompanying drawings wherein.

DETAILED DESCRIPTION

Figure 1:
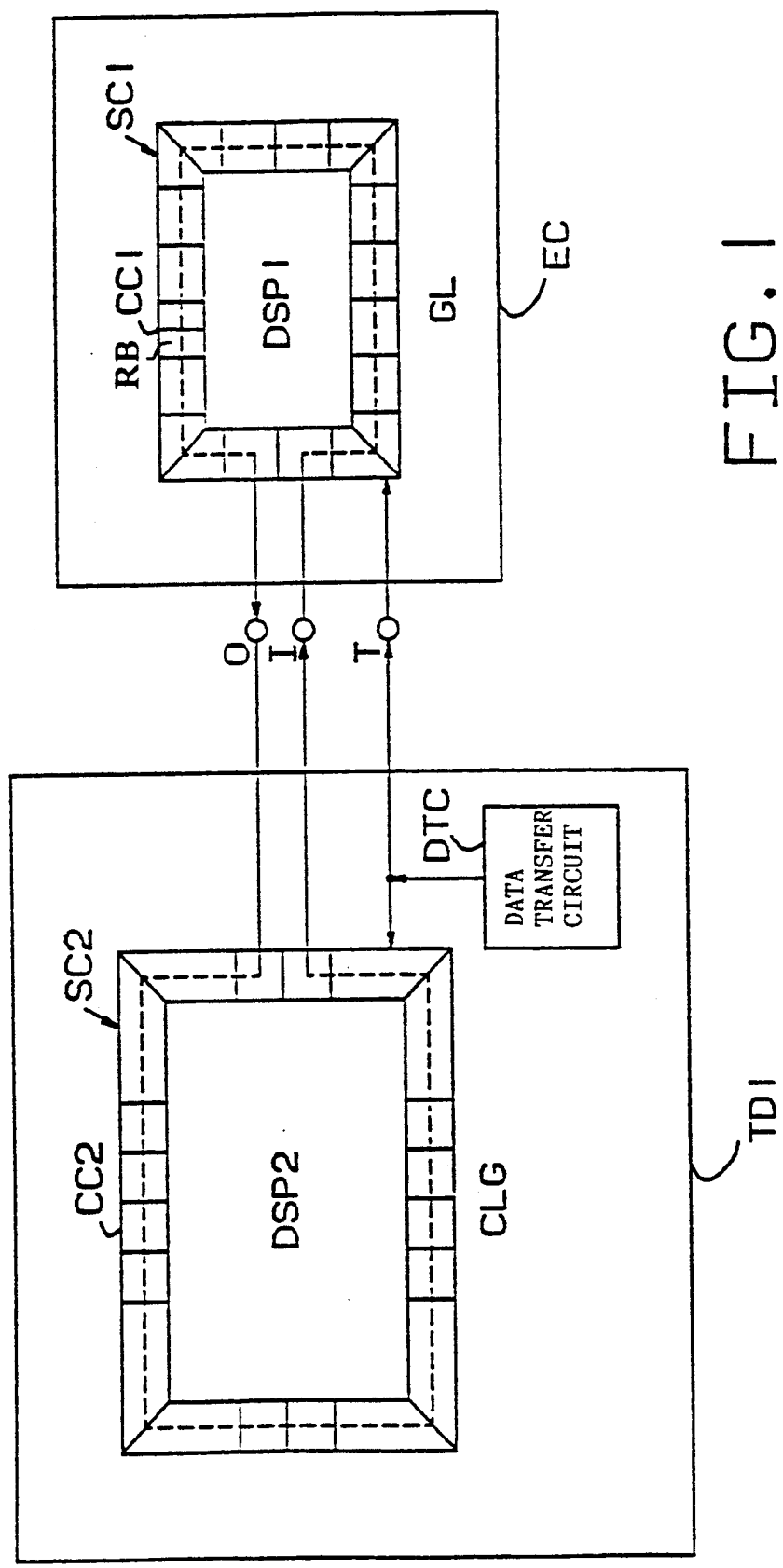
FIG. 1 shows a test device according to the invention and including a test circuit TD1, scan paths SC1 and SC2 used for testing a processor DSP1 in emulation mode.

FIG. 1 shows a test device comprising a test circuit TD1 and a scan path SC1 which is built on an integrated electronic chip EC which further includes a processor DSP1 and a so-called "GLUE" logic GL, i.e. other circuits such as interfaces, memories, etc . . . The test circuit TD1 further includes a processor DSP2, control logic CLG (not described in detail here), another scan path SC2 serially connected to the scan path SC1 in order to allow the processor DSP2 to run in the real environment, i.e. with the same glue logic GL, as the processor DSP1, as will become clear later, and a data transfer circuit DTC.

Figure 2:
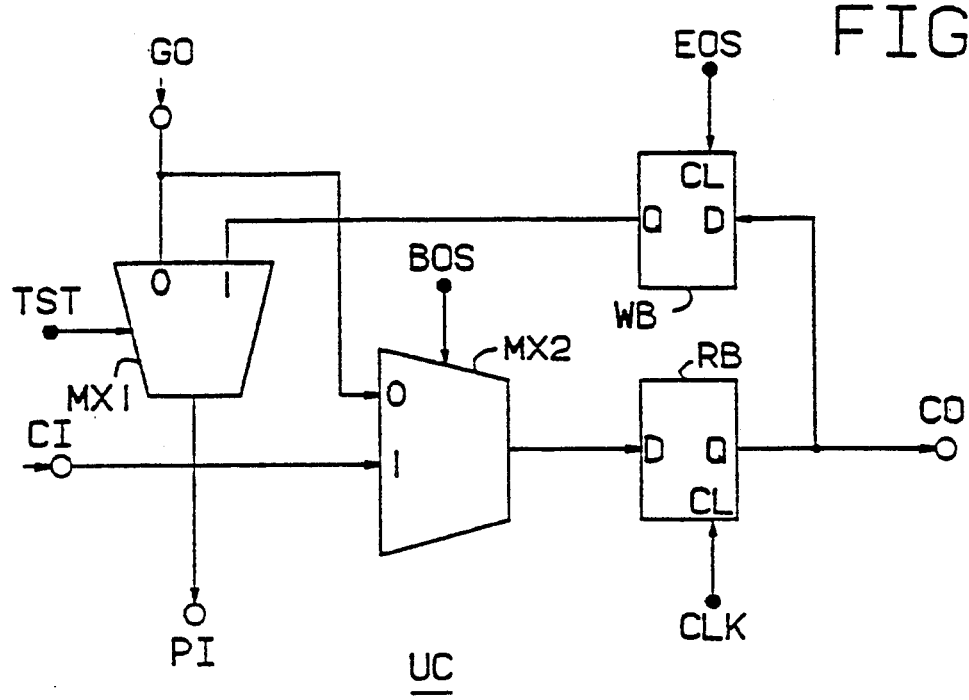
FIG. 2 shows an unidirectional cell UC which may be used as a cell CC1 of the scan path SC1 of FIG. 1.
Figure 3:
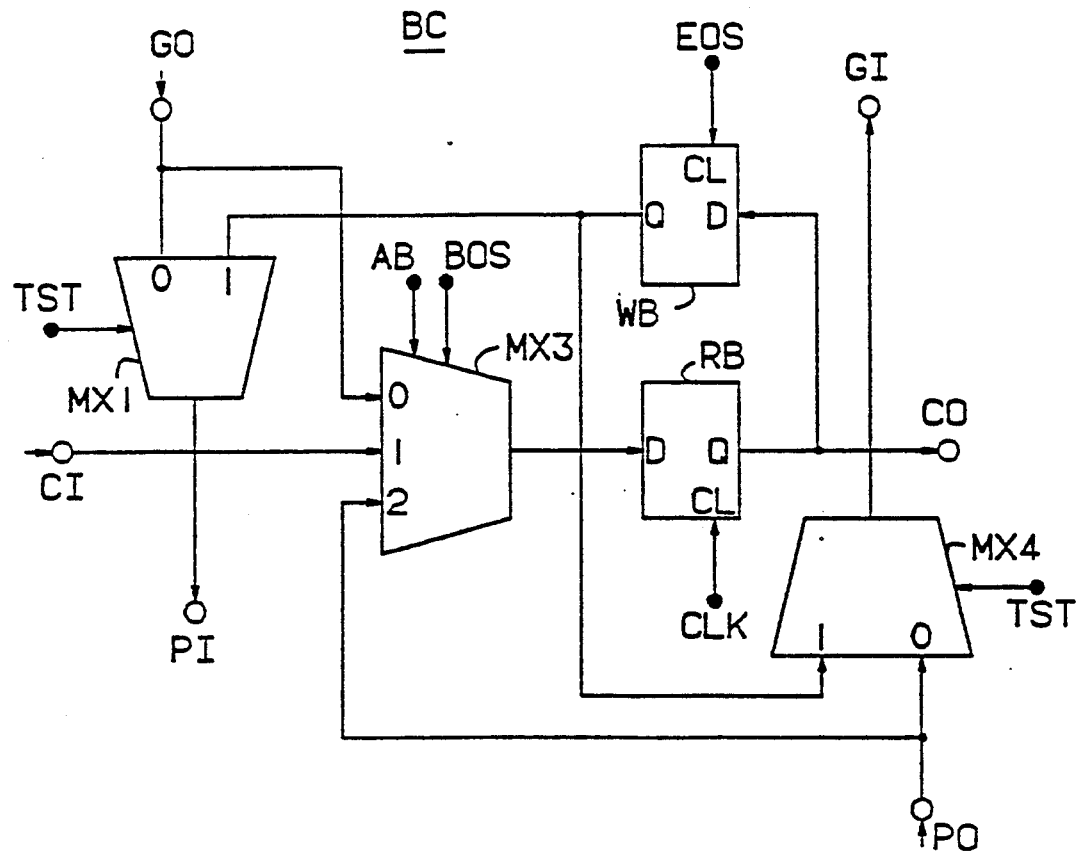
FIG. 3 shows an bidirectional cell BC which may be used as a cell CC1 of the scan path SC1 of FIG. 1.

The scan path SC1 is an interface between the processor DSP1 and the glue logic GL and is constituted by a string of serially connected cells, such as CC1, surrounding the processor DSP1. Each cell CC1 is either of the unidirectional or bidirectional type, i.e. able to transfer data bits unidirectinally from GL to DSP1 or from DSP1 to GL, or bidirectionally between GL and DSP1 in a transparent way respectively. An unidirectional cell UC is shown in FIG. 2 and a bidirectional cell BC is represented in FIG. 3. The operation of both UC and BC will be explained in more detail later.

The scan path SC2 included in the test circuit TD1 is similar to the scan path SC1 built on the chip EC, i.e. it includes a same number of serially connected cells, such as CC2, and surrounds the processor DSP2.

Each cell, CC1 or CC2, includes a read buffer RB and a write buffer WB (both shown in the FIGS. 2 and 3). The read buffer RB is able to latch a data bit transferred through the corresponding cell. For instance, when such a data bit is transferred between the glue logic GL and the processor DSP1 through the scan path SC1, this data bit may also be latched in the read buffer RB. The write buffer WB is able to latch a data bit to be transmitted, e.g., to the glue logic GL and/or to a processor DSP1 or DSP2. Hereby a data bit latched in a write buffer WB always passes first through the associated read buffer RB.

All the read buffers RB of a same scan paths SC1 or SC2 are connected in series and each end of a scan path, i.e. the end of the string of cells CC1 or CC2, is connected to a corresponding end of the other scan path via a respective external terminal I or O of the chip EC. The read buffers RB of the two scan paths SC1 and SC2 are thus interconnected so as to form a ring.

The above mentioned data transfer circuit DTC of TD1 is connected directly to all the cells CC2 of the scan path SC2 and via a set of external terminals, generally indicated by T in FIG. 1, to all the cells CC1 of the scan path SC1. The data transfer circuit DTC generates control signals for shifting the data bits latched in the read buffers RB of the scan path SC1 to the read buffers of the scan path SC2, and vice versa.

The data transfer circuit DTC further also controls the transfer of data bits:

from the glue logic GL to the read buffers RB of the cells CC1 of the scan path SC1;

from the write buffers WB of the cells CC1 of the scan path SC1 to the glue logic GL;

from the processor DSP2 to the read buffers RB of the cells CC2 of the scan path SC2;

from the write buffers WB of the cells CC2 of the scan path SC2 to the processor DSP2; and, in case of a variant TD2 (described later) of the test circuit TD1 is used, from the processor DSP1 to the read buffers RB of the cells CC1 of the scan path SC1;

from the write buffers WB of the cells CC1 of the scan path SC1 to the processor DSP1.

All these shifts and transfers of data bits through the cells occur by means of control signals TST, BOS, CLK, EOS and AB generated by DTC and described later in relation to the FIGS. 2 and 3.

The purpose of the test device is to emulate the operation of the processor DSP1. During this test, the processor DSP1 of the chip EC is disconnected or isolated from the other circuits constituting its environment, i.e. from the glue logic GL, and functionally replaced by the processor DSP2 of TD1 in order to perform the requested emulation. The processor DSP2 may for instance be more performant than DSP1 and/or include a different software programme so that the behaviour of the other circuits together with this processor DSP2 may be checked.

The test device operates as follows.

During each processing step of the processor DSP2 a full exchange of data occurs between the read buffers RB of the scan path SC1 and those of the scan path SC2.

For instance, when during a processing step of DSP2 a data bit from the glue logic GL and intended for the—now disconnected—processor DSP1 passes through a cell CC1, this data bit is captured and latched in the read buffer RB of this cell CC1. Before the occurrence of the next following processing step of DSP2, this data bit is transferred to the read buffer RB of a corresponding cell CC2 of the scan path SC2. This transfer occurs under the control of the data transfer circuit DTC as mentioned above. In the cell CC2, the data bit is transmitted from the read buffer RB to the write buffer WB from where it is then transmitted to the processor DSP2 which is able to handle it.

If, simultaneously, the processor DSP2 intends for transfer a data bit to the glue logic GL, this data bit is first latched in the read buffer RB of a cell CC2 and then transferred to the read buffer RB of a corresponding cell CC1 in the scan path SC1. From this read buffer RB the data bit is transmitted to the write buffer WB of the cell CC1 and so further to the glue logic GL.

As already mentioned an unidirectional cell UC is shown in detail in FIG. 2. This cell UC is for instance used in the scan path SC1 for allowing the transfer of data bits from the glue logic GL to the processor DSP1. The cell UC is therefore provided with a first input GO on which the data bits from GL are received, and with a first output PI where the data bits intended for DSP1 are available. The cell UC further has a second input CI for receiving data bits from the read buffer RB of the preceding cell in the scan path SC1, and a second output CO for transmitting data bits to the read buffer RB of the next following cell in this scan path SC1.

Additionally to the read RB and write WB buffers which are each constituted by a D-flip flop, the cell UC includes two multiplexers MX1 and MX2. The input GO is connected to a first input 0 of the multiplexer MX1 as well as to a first input 0 of the multiplexer MX2, the output of MX1 being connected to the first output PI. The second input CI is connected to the D-input of the read buffer RB via the multiplexer MX2 and more particularly via a second input 1 thereof. The Q-output of RB is connected to the second output CO as well as to the D-input of the write buffer WB, the Q-output of the latter being connected to a second input 1 of the multiplexer MX1.

The above mentioned control signals TST, BOS, CLK and EOS which are generated by the data transfer circuit DTC (FIG. 1) are applied to the cell UC via the above mentioned set of external terminals T of the chip EC.

In more detail, the control signal TST is applied to the first multiplexer MX1 in order to select either the first 0 or the second 1 input thereof. When the control signal TST selects the first input 0 of MX1, a data bit applied by the glue logic GL to the input GO is transmitted to the processor DSP1 via the multiplexer MX1 and the output PI. The cell UC then acts as a transparent device for this data bit. It is to be noted that the same data bit is also applied to the input 0 of the multiplexer MX2. On the other hand when the control signal TST selects the input 1 of MX1, the data bit latched in the write buffer WB is then transferred to the processor DSP1 instead of a data bit coming from the glue logic GL via the input GO. This possibility is for instance used in the scan path SC2 when a data bit is transferred from a cell CC2 to the processor DSP2.

The control signal BOS is applied to the multiplexer MX2 for controlling the transfer of data bits to the read buffer RB and selects either the input 0 or 1 of this multiplexer MX2. When the control signal BOS selects the input 0 of MX2, the above data bit coming from GL via the input GO is transmitted to RB whilst when the input 1 of MX2 is selected, the data bit applied to the input CI of the cell UC is transmitted to RB. It is to be noted that since all the cells of a scan path are connected in series, the data bit applied at the input CI of one of these cells is coming from the preceding cell in this scan path.

The control signal CLK is a clock is a clock signal applied to the clock input CL of the read buffer RB. CLK controls the shift transfer rate of the data bits in the scan path, i.e. the rate at which the data bits are transmitted from the read buffer RB of a cell to the read buffer of the next following cell in this scan path. This clock signal CLK thus controls the above transfer of data bits from the scan path SC1 to the scan path SC2 and vice versa.

Finally, the control signal EOS is applied to the clock input CL of the write buffer WB and controls the latching of a data bit therein. In other words, the control signal EOS allows the data bit transmitted from the read buffer RB to the output CO to be latched in the write buffer WB, or inhibits this latching.

A bidirectional cell BC is shown in detail in FIG. 3. It is similar the above described cell UC. However, the multiplexer MX2 has been replaced by a multiplexer MX3 and an additional multiplexer MX4 is used. The cell BC also has a third input PO to which the data bits coming from the processor DSP1—in the above example—are applied and a third output GI on which the data bits intended for the glue logic GL are available.

The multiplexer MX3 has inputs 0 and 1 connected as those of the multiplexer MX2 and a third input 2 to which the input PO is connected. This input PO is further connected to an input 0 of the multiplexer MX4 of which the ouput is connected to the output GI. The output of the write buffer WB, connected to the input 1 of the multiplexer MX1, is further also connected to an input 1 of the multiplexer MX4.

The data transfer circuit DTC is able to apply supplementary control signal AB to the multiplexer MX3 for selecting either the input 0 or 2 thereof when the control signal BOS also applied to MX3 selects the data bit coming from the input GO—or PO—to be applied to the read buffer RB.

The above mentioned control signal TST is also applied to the multiplexer MX4 in order to select either the input 0 or 1 thereof. When this control signal selects the input 0 of MX4, the cell BC acts as a transparant device for the data bits transmitted from the processor DSP1 to the glue logic GL via the input PO and the output GI respectively. On the other hand, when the control signal TST selects the input 1 of MX4, the data bit then latched in the write buffer WB is transmitted to the glue logic GL instead of the data bit appied to the input PO.

Figure 4:
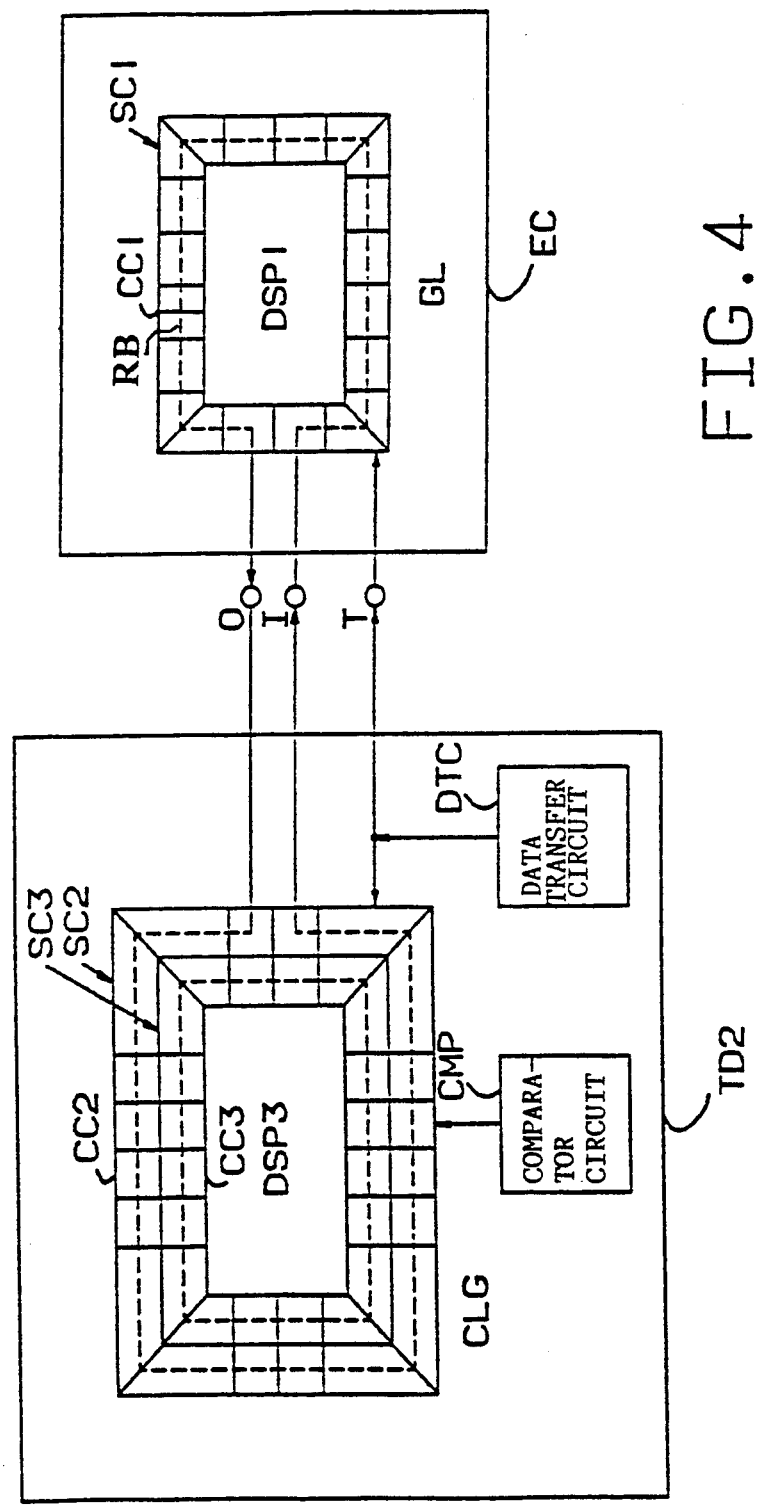
FIG. 4 shows a variant TD2 of the test circuit TD1 of FIG. 1 for testing the processor DSP1 in observation mode.

FIG. 4 shows a variant TD2 of the test circuit TD1 of FIG. 1. The test circuit TD2 is comparable to the test circuit TD1 wherein the "emulating" processor DSP2 is replaced by an "observating" processor DSP3. TD2 thus includes a processor DSP3 instead of the processor DSP2 of TD1, and additionaly includes a scan path SC3 which is also constituted by a string of cells, such as CC3, including a same number of cells as SC1 and SC2 and surroundig the processor DSP3, and a comparator CMP coupled to both the scan paths SC2 and SC3 for comparing the data bits latched in read buffers of corresponding cells CC2/ CC3 thereof.

This test circuit TD2 is used for testing the processor DSP1 in observation mode. In this mode, both the processor DSP1 on the chip EC and the identical processor DSP3 forming part of the test circuit TD2 simultaneously run with the same data and at the same normal processing speed and the results of their operations are permanently compared in CMP. This test device may thus be seen as a "watch-dog" able to give an alarm when the results of DSP1 and DSP3 are not identical.

In this test device, a data bit generated by the glue logic GL and intended for the processor DSP1 is transmitted not only to the latter processor DSP1 via the scan path SC1 but also to the processor DSP3 via the scan path SC2 as described above. This means that both the processors DSP1 and DSP3 then receive the same data bit from the glue logic GL. Both these processors then handle this data bit—or data bits since the contents of all the cells CC1 is transferred to all the cells CC2—and generate a resulting data bit. The resulting data bit of the processor DSP1 is applied to and latched in the read buffer RB of a cell CC1 of the scan path SC1, whilst that of the processor DSP3 is applied to and latched in the read buffer RB of a corresponding cell CC3 of the scan path SC3.

Owing to the transfer of the data bits between the scan paths SC1 and SC2, the data bit then latched in the read buffer RB of CC1 is also available in the read buffer RB of a corresponding cell CC2. The comparator CMP then reads the data bit latched in this read buffer RB of CC2 and the one latched in the read buffer RB of the corresponding cell CC3 and compares them. When these two data bits are different an alarm signal may be generated by the test circuit TD2.

It is to be noted that in case the transfer of the data bits between the scan paths SC1 and SC2 can not be completed within one processing step of the processor due to the high operating rate of the latter, it is possible to slow down the normal processing speed of this processor and still perform the requested test.

While the principles of the invention have been described above in connection with specific apparatus, it is to be clearly understood that this description is made only by way of example and not as a limitation on the scope of the invention.

We claim:

1. A test device for testing an integrated electronic chip, said test device comprising:
   first processor means formed on said integrated electronic chip;
   interface means for interfacing said first processor means with a plurality of other circuits for enabling a transfer of data therebetween in a first and a second direction;
   at least one of said plurality of other circuits being formed on said integrated electronic chip;
   second processor means, external of said integrated electronic chip, coupled to said first processor means;
   said interface means including a first scan path comprising a first string of first cells formed on said integrated electronic chip, said first string of first cells including a plurality of serially connected first read buffer means, a respective one of said first read buffer means being provided in each first cell, for latching first data and for enabling a transfer of said latched first data in a first and a second direction between said at least one of said plurality of other circuits and said first processor means;
   a second scan path, external of the integrated electronic chip, coupled to said second processor means, said second scan path including a second string of second cells, said second string of second cells having a plurality of serially connected second read buffer means, a respective one of said second read buffer means being provided in each second cell for latching second data and for transferring said latched second data between said second processor means and said second scan path;
   connecting means for serially interconnecting said first processor means and said second processor means, said connecting means including a serial interconnection between said first and second read buffer means; and
   data transfer means for serially transferring latched first data from said first read buffer means to said second read buffer means, and for serially transferring latched second data from said second read buffer means to said first read buffer means, at a predetermined transfer rate such that one data transfer is provided at each of a plurality of processor steps of said second processor means.

2. The test device according to claim 1, wherein: each of said first cells further includes first write buffer means for latching said first data received from said first read buffer means prior to a transmission of said first data from said first cells to said at least one of said plurality of other circuits.

3. The test device according to claim 1, wherein each of said second cells further includes second write buffer means for latching said second data received from second read buffer means prior to a transmission of said second data received from said second read buffer to said second processor means.

4. The test device according to claim 1, wherein said second scan path has a number of cells equal to a number of cells in said first scan path.

5. The test device according to claim 1, further comprising:
   first and second terminals formed on said integrated electronic chip;
   said connecting means, serially interconnecting said first and second read buffer means, enabling said first and second data to be transferred between said first and second read buffer means via said first and second terminals of said integrated electronic chip; and each of said first and second terminals of said integrated electronic chip respectively linking an end of said first string of first cells to a corresponding end of said second string of second cells.

6. The test device according to claim 1, wherein said interface means is formed on said integrated electronic chip at a position between said first processor means and said at least one of said plurality of other circuits, so that said interface means surrounds said first processor means.

7. The test device according to claim 6, wherein said second scan path surrounds said second processor means.

8. The test device according to claim 1, wherein said latched first and second data respectively comprise a plurality of bits, each cell in said first and second strings of cells latching a respective one of said plurality of bits.

9. The test device according to claim 1, wherein each of said buffer means comprises a D-flip flop.

10. A test device for testing an integrated electronic chip having a first processor means formed therein, said test device comprising:

interface means formed on said integrated electronic chip for interfacing said first processor means with at least one of a plurality of other circuits and for enabling a transfer of data therebetween in a first and a second direction;

said interface means including a first scan path comprising a first string of first cells;

said first scan path including a plurality of serially connected first read buffer means, a respective one of said read buffer means being provided in each of said first cells in said first string for latching first data and for transferring said first data between said first processor means and at least one of said plurality of other circuits;

second processor means provided external of said integrated electronic chip, substantially identical to said first processor means, and operating at a processing speed corresponding to a processing speed of said first processor means;

a second scan path external of the integrated electronic chip, coupled to said second processor means, said second scan path comprising a second string of second cells;

said second string of second cells including a plurality of serially connected second read buffer means, a respective one of said second read buffer means being provided in each of said second cells in said second string for latching second data;

connecting means for serially interconnecting said second read buffer means with said first read buffer means;

data transfer means for serially transferring latched first data from said first read buffer means to said second read buffer means, and for transferring latched second data from said second read buffer means to said first read buffer means, at a predetermined transfer rate such that one data transfer is performed between said first and second read buffer means at each of a plurality of processing steps of said first processor means;

a third scan path comprising a third string of third cells, said third string of third cells including serially connected third read buffer means, a respective one of said third read buffer means being provided in each third cell for latching said second data and for transferring said second data between said second processor means and said third scan path; and comparator means for comparing, at each of said plurality of processing steps, said second data received in said third scan path from said second processor means with said first data received in said second scan path from said first processor 11. The test device according to claim 10, wherein:

each of said first cells further includes first write buffer means for latching said first data received from said first read buffer means, prior to a transmission of said first data from said first cells to said at least one of said plurality of other circuits.

12. The test device according to claim 10, wherein each of said second cells further includes second write buffer means for latching said second data received from said second read buffer means prior to a transmission of said second data received from said second read buffer to said second processor means.

13. The test device according to claim 10, wherein said second scan path has a number of cells equal to a number of cells in said first scan path.

14. The test device according to claim 10, further comprising:

two terminals formed on said integrated electronic chip;

said connecting means, serially interconnecting said first and second read buffer means, enabling said first and second data to be transferred between said first and second read buffer means via said two terminals of said integrated electronic chip; and each of said two terminals of said integrated electronic chip respectively linking an end of said first string of first cells to a corresponding end of said second string of second cells.

15. The test device according to claim 10, wherein said interface means is formed on said integrated electronic chip at a position between said first processor means and said at least one of said plurality of other circuits, so that said interface means surrounds said first processor means.

16. The test device according to claim 15, wherein said second scan path surrounds said second processor means.

17. The test device according to claim 10, wherein said latched first and second data comprises a plurality of bits respectively latched in said first, second and third strings of cells.

18. The test device according to claim 10, wherein each of said buffer means comprises a D-flip flop.

19. The test device according to claim 10, wherein at least one of said plurality of other circuits is formed on said integrated electronic chip.

20. The test device according to claim 19, wherein said interface means is formed on said integrated electronic chip at a position between said first processor means and said at least one of said plurality of other circuits, so that said interface means surrounds said first processor means.

21. The test device according to claim 10, wherein said first data latched in said first read buffer means of said first string of cells is also transferred between said first processor means and said at least one of said plurality of other circuits.

22. The test device according to claim 10, wherein said third scan path includes a number of cells that is equal to a number of cells in said first scan path.

* * * * *